United States Patent

[11] 3,582,675

[72] Inventors William D. Jordan, Jr. Newtonville; Richard J. Gurski, Lincoln, both of, Mass.
[21] Appl. No. 726,334
[22] Filed May 3, 1968
[45] Patented June 1, 1971
[73] Assignee Teledyne, Inc. Los Angeles, Calif.

[54] ELECTRONIC SWITCHING ARRANGEMENT
5 Claims, 2 Drawing Figs.

[52] U.S. Cl. .......... 307/230, 307/237, 307/251, 307/304, 328/142, 330/9, 330/85, 330/86
[51] Int. Cl. .......... G06g 7/12
[50] Field of Search .......... 307/230, 229, 251, 304, 237; 328/142, 146; 330/9, 110, 85, 86

[56] References Cited

UNITED STATES PATENTS

| | | | |
|---|---|---|---|
| 2,999,169 | 9/1961 | Feiner | 307/230 |
| 3,129,326 | 4/1964 | Balaban | 307/229X |
| 3,231,728 | 1/1966 | Kusto | 330/85X |
| 3,320,532 | 5/1967 | Watters | 330/110X |
| 3,378,779 | 4/1968 | Priddy | 307/304X |
| 3,406,346 | 10/1968 | Wanlass | 307/304X |
| 3,435,252 | 3/1969 | Eubanks | 307/237 |
| 3,476,954 | 11/1969 | Wennik et al. | 307/230X |

*Primary Examiner*—Stanley T. Krawczewicz
*Attorney*—Curtis, Morris and Safford

ABSTRACT: Electronic gating or switching arrangement. A first transistor is connected between the output of an amplifier and an output lead; when on, the transistor provides a direct connection between the amplifier and the output lead, when the transistor is off the amplifier is disconnected from the lead. To minimize the "full-on" resistance of the transistor, a feedback path between the output lead and the input of the amplifier is provided by a second transistor which is turned on when the first is turned on, and off when the first is turned off. Feedback control of the amplifier is provided independently of the two transistors by a resistor connected between the output and input of the amplifier. This arrangement minimizes switching transients, and reduces to negligible amount the impedance presented to the output lead by the amplifier when gated "on."

Figure 1:
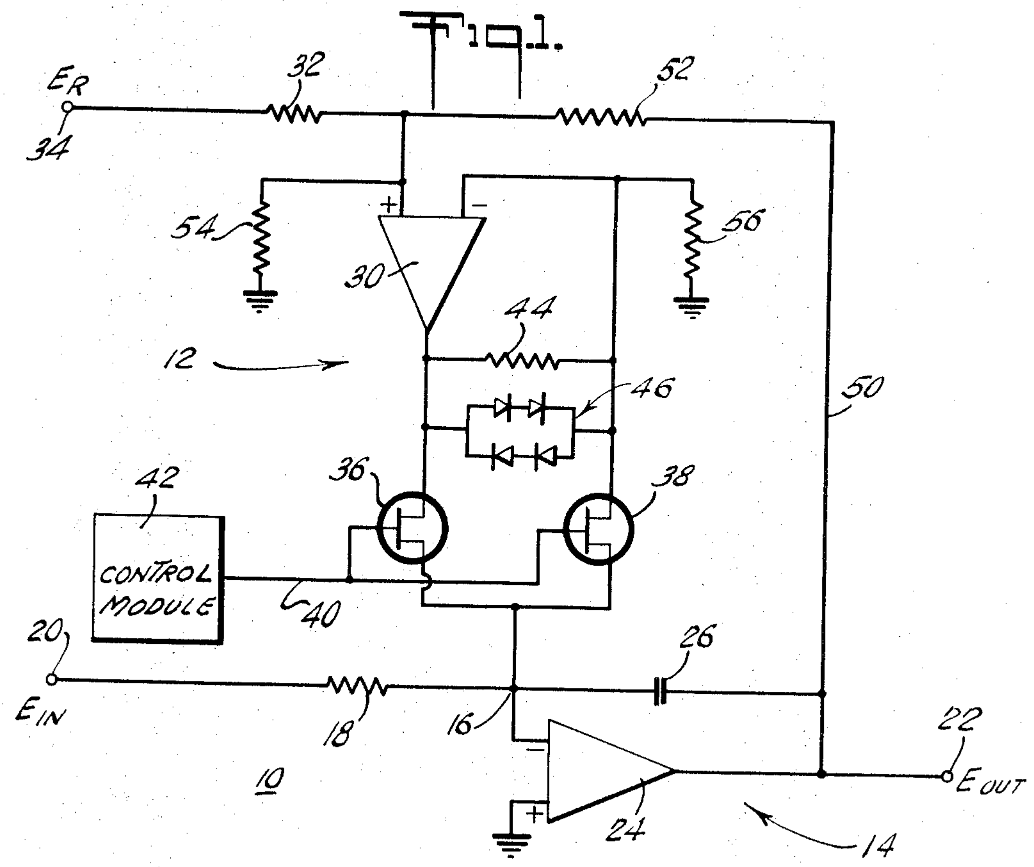

INVENTORS:
WILLIAM D. JORDAN, JR.
RICHARD J. GURSKI
BY
Curtis, Morris & Safford
ATTORNEYS.

ELECTRONIC SWITCHING ARRANGEMENT

This invention relates to an improved arrangement for switching or gating in and out of an electronic circuit, such as an analog computer, a portion thereof.

An object of the invention is to provide an arrangement for electronic switching which does not introduce errors such as caused by transients or by switch impedance, and which is fast and reliable in operation.

Another object is to provide a gating arrangement by which an integrator circuit of an analog computer, for example, can be reset to an initial condition rapidly and with a high degree of accuracy.

A further object is to provide a gating circuit by which an operational amplifier can be easily and accurately controlled.

Still another object is to provide such a gating circuit which is simple and inexpensive yet highly effective.

These and other objects will in part be understood from and in part pointed out in the following description.

As is well known in the art, an operational amplifier is a high gain DC amplifier designed for low noise and drift, and for use with various modes of feedback in such applications as analog computation. Typically, such an amplifier operates with inputs of the order of millivolts and microamperes to give a low impedance output of a volt or more with great accuracy (e.g. 0.01 percent error). Thus errors of even millivolt level at the input can cause considerable inaccuracy of the output voltage. One of the problems in switching or gating such an amplifier in and out of a circuit or into a different mode of operation is to avoid the transients, switch impedance, drift, noise, etc. normally associated with known ways of switching. The present invention provides a simple yet highly effective way of circumventing these difficulties.

In accordance with the invention in one specific embodiment thereof an operational amplifier has connected between itself and an output terminal a first field effect transistor. This serves as an electronic switch to connect or disconnect the output terminal from the amplifier. When "off", this transistor appears essentially an open circuit between the output terminal and the amplifier. However, even when fully on instead of appearing as an ideal switch with zero ohmage, the transistor has an impedance of many ohms (e.g. several hundred). Now, in order to reduce to negligible degree the effect on the circuit of the "on" impedance of this transistor it is made part of a negative feedback loop from the output of the amplifier to one of its inputs. To this end, a second field effect transistor is connected in a path from the output terminal to an input of the amplifier. Both of these transistors are turned on together, and off together. When both are on, the impedance of the amplifier as seen at the output terminal is very low, the output impedance of the amplifier in series with the impedance of the first transistor having been reduced orders of magnitude by the feedback through the second transistor.

When both transistors are off, the feedback loop through them is of course open. To maintain feedback control of the amplifier a second feedback path in the form of a relatively high ohmage resistor is connected directly between the output of the amplifier and its input. This second feedback means, being independent of the first and second transistors, takes over control when they are turned off. It is shunted by the relatively low impedance of the first and second transistors when they are turned on.

The two field effect transistors are quickly and easily turned on and off by the application of a control voltage to their respective gates. Being external to the amplifier itself and in a high level, low impedance portion of the circuit, the usual difficulties of previously known switching arrangements are avoided.

In one circuit, wherein this new switching arrangement is especially useful, the output terminal described above is the summing point or input of an integrator. The latter includes an operational amplifier with integrating feedback. The integrator is periodically, and with speed and accuracy, reset to a desired initial voltage condition by switching the output of the first amplifier onto the summing point and forcing in current at relatively low impedance until the reset condition is obtained. Then the first amplifier is switched out of circuit, and another cycle of integration allowed to proceed, and so on. The speed, accuracy, and simplicity with which the first amplifier can be gated on or off considerably improves the usefulness of the overall circuit.

Figure 2:
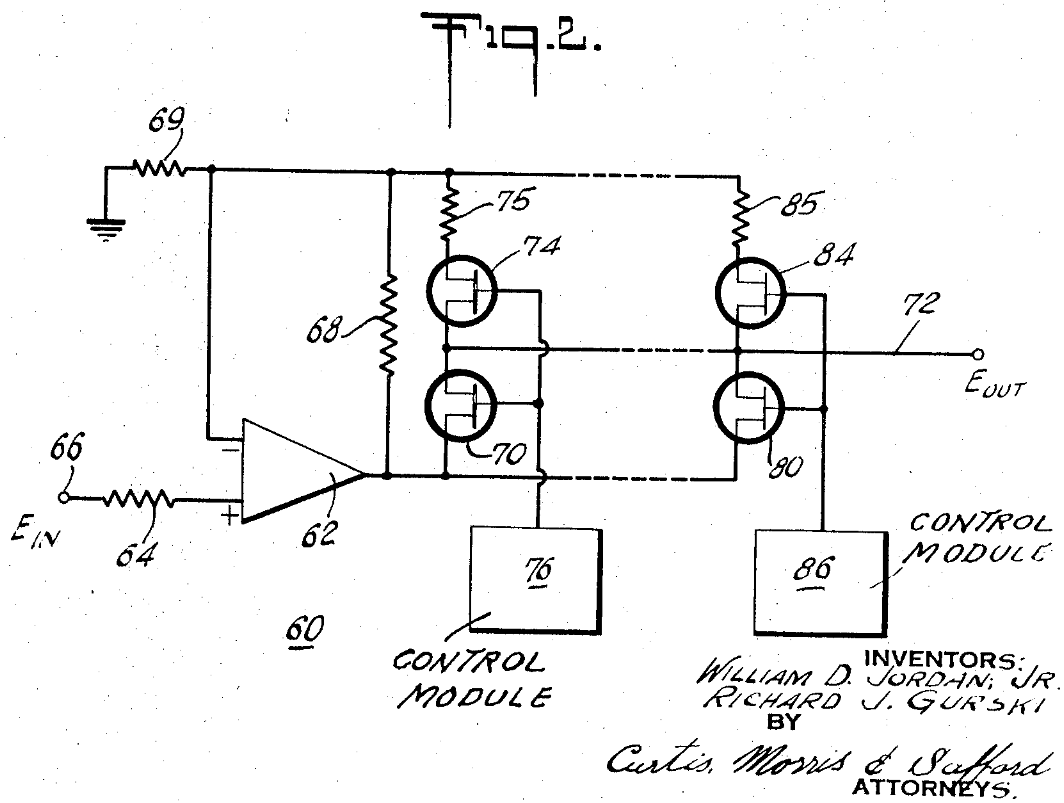

A better understanding of the invention together with a fuller appreciation of its many advantages will best be gained from a study of the following description given in connection with the accompanying drawings wherein:

FIG. 1 is an integrator circuit embodying a switching arrangement according to the invention; and FIG. 2 is an adjustable gain amplifier circuit embodying features of the invention.

The circuit 10 shown in FIG. 1 comprises a first resetting amplifier portion, generally indicated at 12 and an integrator portion, generally indicated at 14. The output of portion 12 is connected to a junction point 16 to which the input of the second portion is also connected. Applied to point 16 through a relatively high ohmage resistor 18 and an input terminal 20 is an input voltage $E_{IN}$, the time-integral of which is to measured. At the right of circuit 10 an output voltage corresponding to the integral of the input voltage is obtained at a terminal 22. Periodically the output voltage is reset to an initial condition by briefly connecting circuit portion 12 to point 16, as will be explained below.

Connected to junction point 16 is the negative input of an operational amplifier 24, the output of which is connected to output terminal 22. The output voltage is fed back through a capacitor 26 to junction point 16, this arrangement of amplifier 24, capacitor 26, and resistor 18 being well known in the art as a way of integrating a voltage $E_{IN}$. Amplifier 24 can be any suitable high quality operational amplifier, such as a Model FP25B, manufactured by Philbrick/Nexus Research.

Resetting circuit portion 12 includes an operational amplifier 30 (which can be the same kind as amplifier 24), the positive input of which is connected through an isolating resistor 32 and an input terminal 34 to a reset voltage $E_R$. The output of amplifier 30 is connected through a first field effect transistor 36 to junction point 16. A low impedance feedback path around transistor 36 to the negative input of amplifier 30 is provided by a second field effect transistor 38. Both of these transistors have their gates connected in parallel to the output lead 40 of a control module 42. The latter, which may for example comprise a flip-flop, applies on command to lead 40 a voltage level which turns on both transistors, or a voltage level which turns off both transistors.

When both transistors 36 and 38 are off, circuit portion 12 is disconnected from junction point 16. In order however to keep local feedback control of amplifier 30, there is connected from the output of amplifier 30 to its negative input a resistor 44 having a resistance (e.g. 50,000 ohms) much larger than the "on" resistance of transistor 38. Resistor 44 is paralleled by two pairs of silicon diodes, generally indicated at 46, which provide overload protection by limiting in known manner the output of amplifier 30 when its voltage comes up to the conduction level of one or the other pair of diodes 46.

The output of circuit 10 is connected via a lead 50 and a feedback resistor 52 (e.g. 100,000 ohms) to the positive input of amplifier 30. This input is connected to ground through a stabilizing resistor 54. Similarly the negative input of the amplifier is connected to ground through a resistor 56. Resistors 54 and 56 may, for example, be several thousand ohms apiece.

When transistors 36 and 38 are on, amplifier 30 quickly drives the output voltage at terminal 22 to the value determined by the reset voltage $E_R$. As explained above, the impedance presented by circuit portion 12 at junction point 16 is very small even though the "full-on" impedance of transistor 36 is many ohms. Resistors 18 is of relatively high ohmage compared to the output impedance of portion 12 and therefore the voltage $E_{IN}$ at terminal 20 is effectively shunted out when circuit portion 12 is on. Transistor 36 should be large enough to handle the surge of current to or from junction 16 when portion 12 is gated on.

The circuit 60 shown in FIG. 2 comprises a variable gain amplifier embodying the invention. This includes an operational amplifier 62, the positive input of which is connected through an isolating resistor 64 to an input terminal 66. The output of the amplifier is connected via a resistor 68 to the negative input of the amplifier. This input is bypassed to ground by a resistor 69 of smaller ohmage than resistor 68.

To control the gain of the circuit, a first transistor 70 (similar to transistor 36 in FIG. 1) is connected between the output of amplifier 62 and an output lead 72, and a second, feedback transistor 74 in series with a resistor 75 are connected between lead 72 and the negative input of the amplifier. Transistors 70 and 74 are turned on and off together by a control signal applied to their gates from a module 76 (similar to module 42).

When transistors 70 and 74 are on, lead 72 is connected to the output of amplifier 62, and the gain of the amplifier is determined by the amount of negative feedback provided through transistor 74 and resistor 75, resistor 69 serving as a voltage-dividing shunt. By proper choice of resistor 75 the gain of the overall circuit can be set at a desired value. A different value of gain is obtained in similar manner by transistors 80 and 84 in conjunction with resistor 85 and module 86 connected as shown. Of course, when transistors 80 and 84 are on, transistors 70 and 74 may be on or off depending on the user's choice. If on, then the resulting "gain" corresponds to the parallel combinations of resistance of, for example, 74, 75 in parallel with 84, 85. Other values of gain may be obtained by providing additional elements similar to those just described, as indicated by the dotted lines.

The above description is intended in illustration and not in limitation of the invention. Various changes or modifications in the embodiments described may occur to those skilled in the art and may be made without departing from the spirit or scope of the invention as set forth.

We claim:

1. A resettable, integrating circuit comprising integrating amplifier means to integrate an input signal, said amplifier means having a high impedance input junction point and an output, gated amplifier means to apply current at low impedance to said junction point and quickly reset the voltage at said output, said gated amplifier means including an amplifier having an input to which can be applied a reset signal and having an output, a first switch transistor connected between said gated amplifier output and said junction point, a second switch transistor connected in a feedback path between said junction point and an input of said gated amplifier, said second transistor when on substantially lowering the impedance of said first transistor when on, the impedances of said first and second transistors when off being effectively open-circuit, first feedback means connected between said gated amplifier output and an input thereof, second feedback means connected between said integrating amplifier output and an input of said gated amplifier, and control means to turn said first and second transistors on together and off together.

2. In a gated amplifier circuit wherein an amplifier having an input and an output is to be connected to and disconnected from an output lead, a first field effect transistor connected to the output of said amplifier and connected to said lead, a second field effect transistor connected between said lead and the input of the amplifier, said second transistor when on substantially lowering the impedance of said first transistor when on, said first and second transistors when off being substantially open-circuits, feedback means connected between the output and input of said amplifier, said feedback means having a much higher impedance than that of said second transistor when on, said feedback means providing local feedback control of said amplifier when said second transistor is off, and control means to turn said first and second transistors on together and off together.

3. The arrangement in claim 2 in further combination with a third transistor in a parallel path with the first and a fourth transistor in a parallel path with the third, and second control means to turn said third and fourth transistors on together when said first and second transistors are off, and vice versa.

4. The arrangement in claim 2 wherein said second transistor is in series with a resistor, said resistor adjusting the exact gain of said circuit.

5. A gating circuit of the character described comprising a differential amplifier having a positive and a negative input and an output, means to apply an input signal to the positive input of said amplifier, an output lead, first transistor switching means connected between said amplifier output and said output lead, said means when on providing a low impedance connection from said amplifier output to said lead, second transistor switching means connected in a first feedback path between said lead and said amplifier negative input, said second switching means when on substantially lowering the impedance of said first switching means, control means to turn said first and second transistor switching means on and off together, and feedback means providing a local control path from said amplifier output to said negative input, whereby low impedance, low transient switching is provided between said amplifier and said output lead.